United States Patent
Kebinger et al.

(10) Patent No.: US 7,528,680 B2
(45) Date of Patent: May 5, 2009

(54) ELECTRICAL FILTER

(75) Inventors: Herbert Kebinger, Mettenheim Hart (DE); Wolfgang Klein, Zorneding (DE)

(73) Assignee: Infineon Technologies AG, Munich (DE)

( * ) Notice: Subject to any disclaimer, the term of this patent is extended or adjusted under 35 U.S.C. 154(b) by 90 days.

(21) Appl. No.: 11/657,397

(22) Filed: Jan. 24, 2007

(65) Prior Publication Data

US 2007/0188266 A1 Aug. 16, 2007

(30) Foreign Application Priority Data

Jan. 24, 2006 (DE) .................. 10 2006 003 379

(51) Int. Cl.
*H03H 7/00* (2006.01)

(52) U.S. Cl. .................. 333/181; 333/12; 333/109; 333/112

(58) Field of Classification Search ............... None
See application file for complete search history.

(56) References Cited

U.S. PATENT DOCUMENTS

| | | |
|---|---|---|
| 3,972,020 A | 7/1976 | Carroll et al. |
| 4,667,173 A * | 5/1987 | Okochi .................. 333/177 |
| 6,781,799 B2 | 8/2004 | Seyama et al. |
| 6,873,224 B2 * | 3/2005 | Chominski .................. 333/112 |

FOREIGN PATENT DOCUMENTS

DE 25 54 799 C2 9/1985

OTHER PUBLICATIONS

Coilcraft, "USB 2.0 Common Mode Filter-1206," Technical Data Sheet available at www.coilcraft.com. 2 pages, no date.
Panasonic, "Common Mode Noise Filter Array-Type EXC28CE," Technical Data Sheet printed on Mar. 21, 2007. 5 pages.
Panasonic, "Common Mode Noise Filters—Type EXC24CD," Technical Data Sheet printed on Mar. 21, 2007. 5 pages.

* cited by examiner

*Primary Examiner*—Anh Q Tran
(74) *Attorney, Agent, or Firm*—Maginot, Moore & Beck

(57) ABSTRACT

An electrical filter has at least four terminals, two inductances and two capacitors. The first inductance is connected between the first terminal and the second terminal, and a second inductance is connected between the third terminal and the fourth terminal. The first capacitance is connected between the first terminal and a reference potential, and the second capacitance is connected between the third terminal and the reference potential. The first inductance and the second inductance form a transformer having a coupling coefficient of a magnitude such that the filter acts as a low-pass filter for differential signals and common mode signals, a cutoff frequency for differential signals being higher than a cutoff frequency for common mode signals.

20 Claims, 6 Drawing Sheets

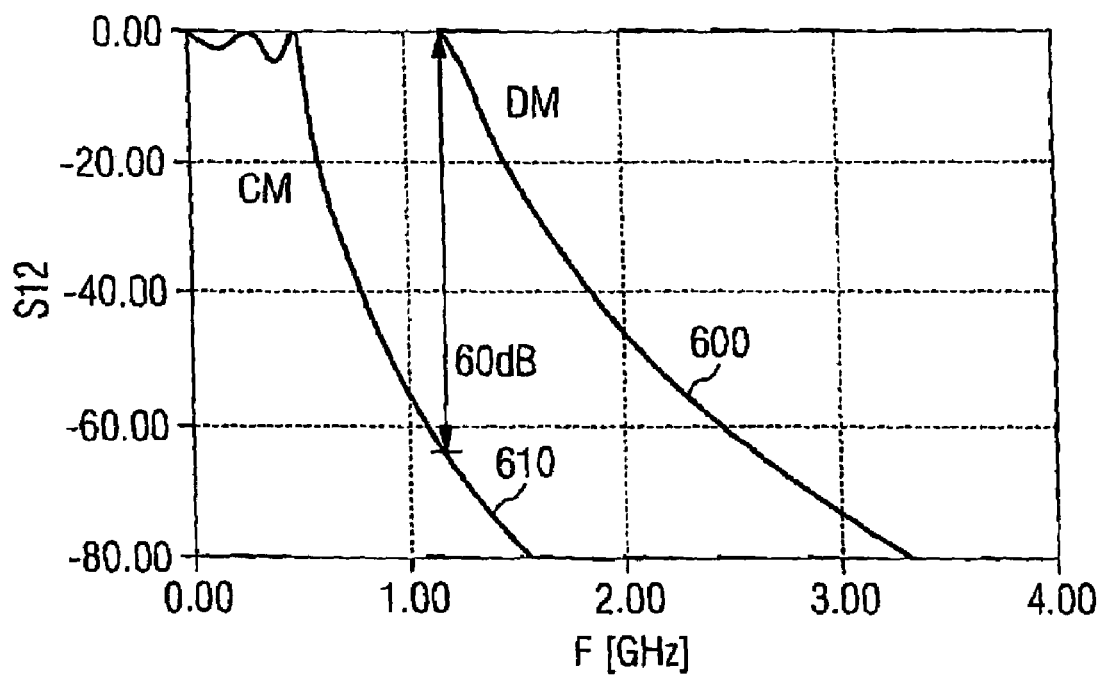

ELECTRICAL FILTER

CROSS-REFERENCE TO RELATED APPLICATION

This application claims priority from German Patent Application No. 10 2006 003 379.5, which was filed on Jan. 24, 2006, and is incorporated herein by reference in its entirety.

BACKGROUND OF THE INVENTION

1. Field of the Invention

The present invention relates to an electrical filter, in particular to an electrical filter which can be used for filtering external disturbances in differential data lines.

2. Description of Related Art

In systems using differential data lines for transmitting signals, a considerable problem is filtering out external disturbances in the broadest band possible. Examples of this are disturbances which are, for example, caused by the fact that strong transmitters couple in the data lines so that these disturbances generally occur as common mode signals. Common mode signal in this context means a signal which is present on at least two signal or data lines in a common mode. Signals which occur in a common mode here are signals which, in the ideal case, exist on the different data lines without any phase shift or temporal shift. However, in real cases, such signals which have a phase shift of a magnitude of less than 30°, preferably less than 10° to one another, will still be referred to as common mode signals. In contrast to disturbances, data are transported via differential data lines in the form of differential signals, i.e. in the form of essentially anti-phase signals. An anti-phase or differential signal in the present application is a signal which, in the ideal case, has a phase shift of 180° on the different data lines. However, in real cases, even such signals having a phase shift of 150° to 210°, preferably 170° to 190° to one another will still be referred to as being anti-phase or differential.

Thus, the frequency of the differential signal may even be higher than the frequency of the external disturbance or the respective disturbance signal.

Common mode noise filters, for example, are required at present to block disturbances caused by mobile phones at USB interfaces. Other fields of application of these common mode noise filters are in the field of differential high-speed transmission circuits for transmitting signals operating according to the USB 2.0 standard already mentioned, also according to the IEEE 1394 standard known as Firewire® in wire-based networks, and according to different LVDS (low voltage differential signaling) standards. Such filters are, for example, applied in the field of signal transmission according to the USB 2.0 and IEEE 1394 standards in small mobile apparatuses, such as, for example, digital cameras, digital video recorders, notebooks, PDAs (personal data assistants) and PCs. In the field of other LVDS data lines, such filters are, for example, employed when transmitting signals between notebooks, PCs and LCD (liquid crystal display) screens and other peripherals operating according to an LVDS standard.

According to the conventional art, such signals are realized by discrete, comparatively large and expensive transformers using ferrites to increase inductance. Examples of such filters are EXC24CD and EXC28CE-type filters by Panasonic® or Matsushita Electronic Components Co., Ltd., the technical data and field of application of which are contained in the respective data sheets and a press report which can be looked at on the homepage of Matsushita Electronic Components Co., Ltd. on the day of application. Another example of a USB 2.0 common mode filter is the 1202 filter family by Coilcraft® Inc. company, the technical data of which are also specified in the technical data sheets which can for example be looked at on Coilcraft®'s homepage on the day of application.

Even if today's solutions exhibit a relatively low direct current resistance, however, the disadvantages of these solutions exceed this advantage by far. The disadvantages of this solution in particular are that the difference in attenuation for the common mode and the differential mode is relatively low and that the attenuation of the differential mode is reduced considerably with higher frequencies, i.e. for example in a frequency range above 1 GHz, which becomes evident from measurements of the typical attenuation as a function of the frequency in the common mode and the differential mode. Additionally, the frequency range of the differential signal usable is limited by the self-resonance of the transformer and/or the ferrite material used. As another disadvantage, frequently additional costs are caused due to the fact that measures must be taken for a separate ESD (electrostatic discharge) protection against electrostatic discharges since these filters frequently are located at the interfaces of PCs or other apparatuses from the field of consumer electronics and telecommunications. Even realizing a multi-stage filter concept of the conventional art is of particular disadvantage since in this case several, comparatively large devices have to be connected in series. Frequently, especially in the field of mobile applications, there is no space available for this.

FIG. 5a illustrates a circuit diagram of a transformer filter 800. A first inductance 810 of an electrical inductance value of L1=25 nH is connected between a first terminal 800a and a second terminal 800b, a second inductance 820 of an electrical inductance value of L2=25 nH is connected between a third terminal 800c and a fourth terminal 800d. The first inductance 810 and the second inductance 820 here form a transformer, the winding arrangement of which is illustrated by two black points and selected such that a current flowing through the first inductance 810 causes a magnetic flux of the same sign in the second inductance 820. Due to this winding orientation of the two inductances 810, 820, the two inductances 810, 820 are also referred to as being positively coupled.

The transformer here has a coupling coefficient K of around 1. The coupling coefficient K here is defined as the ratio of a mutual inductance M of one of the two inductances 810, 820 referenced to the respective other of the inductances 810, 820 and the square root of the product of the two values L1 and L2 of the two inductances 810, 820. Thus, the following applies:

$$K = \frac{M}{\sqrt{L1 \cdot L2}}$$

Thus, the transformer has a total conductivity or effective conductivity Ltot depending on the coupling coefficient K fulfilling the following relation:

$Ltot = L1 + L2 + 2M$ relative to the mutual inductance M depending on the coupling coefficient K.

According to the conventional art, an inductive filter which is also referred to as L filter is used. A coupled coil pair and/or a transformer of high inductance is used for filtering, wherein the coupling of the coils and/or inductances in the transformer is close to 1. In the common mode, the transformer thus represents a low-pass filter since in this mode the inductances are positive-coupling so that the impedance, too, becomes very high due to the high resulting effective inductance, as does the resulting attenuation. For the differential mode, the inductances are negative-coupling so that the effective impedance and the resulting attenuation become very low.

The inductances of the differential mode and the common mode on the one hand differ by the effective connection which results in halving in the common mode due to the resulting effective parallel-connection of the inductances and in doubling in the differential mode due to the effective series-connection of the inductances and, on the other hand, due to coupling, wherein there is an effective coupling coefficient of K<0 in the differential mode and an effective coupling coefficient of K>0 in the common mode. Referring to the values L1 and L2 of the two inductances 810, 820 shown in FIG. 5, the result in the common mode is an effective inductance L_CM=100 nH as a total inductance Ltot and in the differential mode an effective inductance L_DM of 0 nH as a total inductance Ltot.

FIG. 5b shows a plotting of a numerically established attenuation S12 as a function of a frequency F of a signal coupled in for different signal modes and different effective inductances for the circuit diagram of a filter 800 illustrated in FIG. 5a. The attenuation forms shown in FIG. 5b are based on a viewing limited to an ideal case where parasitic effects, as may, for example, be caused by (parasitic) inductances, (parasitic) capacitances and/or (parasitic) resistances, are not taken into consideration. In particular, FIG. 5b shows an attenuation form 900 resulting in the case of negative coupling for the filter 800 shown in FIG. 5a and which in FIG. 5b is also referred to as DM standing for differential mode. The attenuation form 900 shows no dependence on the frequency F, but monotonously stays at a value of about 0 dB. The reason for this is the nearly disappearing effective inductance L_DM of the filter 800 shown in FIG. 5a in the differential mode, with which the impedance and thus attenuation of the filter 800 also disappear. In addition, FIG. 5b shows an attenuation form 910 for the filter 800 shown in FIG. 5a in the common mode for an effective inductance L_CM=100 nH which in FIG. 5b is also referred to as CM standing for common mode. With an increasing frequency F starting from an attenuation value of around 0 dB, the attenuation form 910 exhibits a monotonously decreasing form. Based on an effective inductance in the common mode of L_CM=100 nH, exemplarily the result is an effective attenuation of around 11 dB at a frequency of around 1 GHz.

Additionally, to demonstrate that a very high effective inductance L_CM is required in such an L filter having a coupling coefficient K of approximately 1 in order to achieve a very high attenuation in the common mode (CM attenuation), FIG. 5b shows an attenuation form 920 which is based on an effective inductance in the common mode of L_CM=800 nH, i.e. in the case of a symmetrical division of the inductances L1 and L2 of the two inductances 810 and 820 of 200 nH each. It is possible by this increase in the values L1 and L2 of the inductances 810 and 820 to, for example, achieve an attenuation of around 29 dB at around 1 GHz, however, this requires a considerable increase in the inductances L1 and L2 of the two inductances 810, 820 of the transformer of the filter shown in FIG. 5a. Such an increase generally also causes a considerable increase in the space required which frequently, in particular in mobile applications, is not available.

There is a need, therefore, for an electrical filter having an improved filter characteristic for common mode signals and differential signals.

SUMMARY OF THE INVENTION

In accordance with a first aspect, an electrical filter has at least four terminals, two inductances and two capacitors. The first inductance is connected between the first terminal and the second terminal, and a second inductance is connected between the third terminal and the fourth terminal. The first capacitance is connected between the first terminal and a reference potential, and the second capacitance is connected between the third terminal and the reference potential. The first inductance and the second inductance form a transformer having a coupling coefficient of a magnitude such that the filter acts as a low-pass filter for differential signals and common mode signals, a cutoff frequency for differential signals being higher than a cutoff frequency for common mode signals.

BRIEF DESCRIPTION OF THE DRAWINGS

Preferred embodiments of the present invention will be detailed subsequently referring to the appended drawings, in which:

FIGS. 4a and 4b show a circuit diagram of a third embodiment of an inventive filter and a representation of two attenuation forms.

DESCRIPTION OF PREFERRED EMBODIMENTS

Figure 1A:
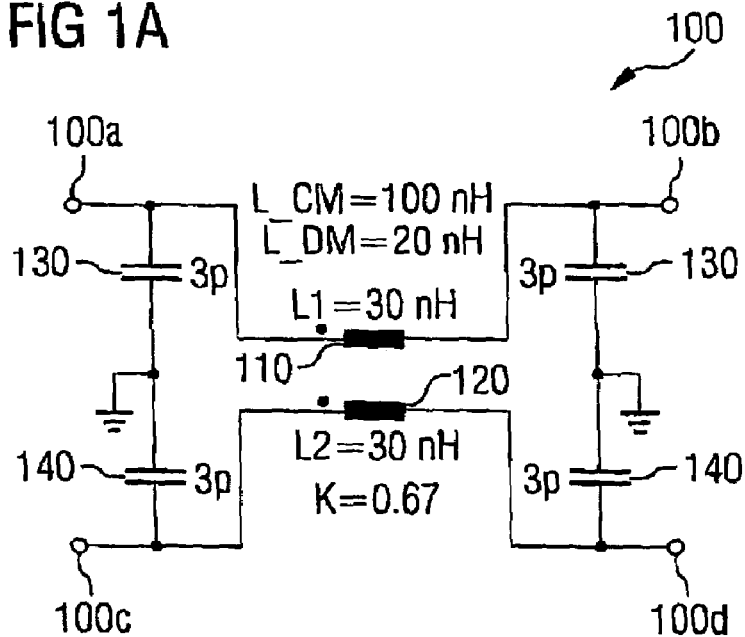
FIGS. 1a and 1b show a circuit diagram of a first embodiment of an inventive filter and a representation of two attenuation forms.

A first embodiment of an inventive electrical filter will be described below referring to FIGS. 1 to 4.

In general, the exemplary embodiments described herein at least partly based on the finding that an electrical filter having an improved filter characteristic for differential signals and common mode signals can be achieved by using an LC filter using a transformer having a coupling coefficient of a magnitude smaller than 1.

At least some embodiments of the invention include an electrical filter that is an LC low-pass filter, i.e. a filter comprising both an inductance and a capacitance. Such a filter differs clearly from the L filter known from the conventional art comprising an inductance but no capacitance. The inductive portion of such an embodiment of the inventive electrical filter is, as is the case in the conventional art, formed by a coupled coil pair and/or a coupled pair of two inductances forming a transformer having high inductance values. The two inductances of the transformer have a coupling of a coupling coefficient of a magnitude smaller than 1.

When using a transformer of a coupling coefficient of a magnitude smaller than 1, the result for a total inductance will be an effective inductance of the inventive filter for differential signals unequal to 0. This allows the inventive filter to act as an LC low-pass filter for differential signals as well so that a special LC low-pass filtering can also be achieved for differential signals. Compared to a conventional prior art filter, this is a significant advantage since-in these filters the effective inductance for differential signals disappears due to the basically complete coupling of a coupling coefficient of roughly 1 so that there is no more LC filtering effect. The inventive filter thus has a cutoff frequency for differential signals and a cutoff frequency for common mode signals. The filter thus allows filtering out in a broad band disturbance signals in the common mode or present as common mode signals, whereas at the same time a differential useful signal or differential signal will only be attenuated slightly by the filter.

Consequently, the exemplary filter described above represents a low-pass filter having a typically low cutoff frequency for common mode signals and a low-pass filter having a typically higher cutoff frequency for differential signals, which in particular in the fields of application aimed at in the field of high-frequency signal transmission provides clear advantages.

Another advantage of embodiments of the invention is the possibility of basically selecting any cutoff frequency for differential signals and common mode signals by correspondingly dimensioning and/or varying the capacitances, inductances and the coupling coefficient of the transformer.

Today's conventional transformers typically have coupling coefficients of a magnitude of nearly 1 so that an inventive LC filter cannot be realized in a discrete setup. If, however, uncoupled inductances are used, the resulting electrical filter will have identical filter characteristics for common mode signals and differential signals. It has been shown that filters having desired characteristics may be implemented using a coupling coefficient between 0.05 and 0.95 and, preferably, between 0.25 and 0.75.

Another advantage of at least some embodiments is that the filter may be manufactured and realized in the form of integrated circuits (ICs), such as, for example, silicon-based, in combination with maybe other circuits and/or circuit units, in a space-efficient manner. Among these circuit units are circuit units or elements serving ESD (electrostatic discharge) protection, so that, as another advantage of the present invention, the filter may be integrated with devices which may, for example, realize ESD protection or serve other functions. Exemplarily, the electrical filter may be realized in an integrated circuit on silicon having coils, capacitors and, maybe, ESD diodes and ESD transistors. The advantage resulting from the design as an integrated circuit thus is that, in contrast to the discrete solution, more complex circuits can be set up, without considerably increasing cost and structural size. By using integrated circuits, the filter may, of course, also be integrated in combination with different circuits and any other devices realizable on integrated circuits.

Apart from one-stage filters, multi-stage inventive filters can also be manufactured and implemented as another advantage of the present invention, as is also the case in classical passive filters. Here, the inductances, capacitances and transformers implemented in every filter stage can be adjusted and optimized specially to the respective application. Thus, it is possible to specially adjust the resulting filter characteristic to the requirements of the application. In particular, the filter characteristic can be improved by connecting several filter stages in series.

Thus, exemplary embodiments of the present invention represent electrical filters for differential data lines, wherein external disturbances in common mode, such as, for example, due to coupling in strong transmitters, can be filtered out in a broad band. Here, the frequency of the differential signal can also be higher than the frequency of the external disturbance. At the same time, the differential useful signal is only attenuated slightly. Embodiments of inventive filters can be applicable to all filter products comprising a high packing density, i.e., exemplarily, in the field of USB interfaces where, for example, disturbances are caused by mobile phones.

FIG. 1 shows a circuit diagram of a first embodiment of an inventive filter 100. The filter 100 comprises a first inductance 110 connected to a first terminal 100a and a second terminal 100b of the filter 100. In addition, the filter 100 comprises a second inductance 120 connected to a third terminal 100c and a fourth terminal 100d of the filter 100. The two inductances 110 and 120 are connected to each other inductively so as to form a transformer of a coupling coefficient K. The two inductances 110 and 120 additionally comprise a winding orientation characterized by the two black points in FIG. 1a. Here, the orientation of the windings is designed such that when a current flows through the first inductance 110 and produces a magnetic flux of a positive sign in the first inductance 110, a magnetic flux of the same sign is also caused in the second inductance 120. Due to this winding orientation of the two inductances 110 and 120, the two inductances 110 and 120 are also referred to as positively coupled. The same applies to a current flowing through the second inductance 120 and resulting in a magnetic flux in the first inductance 110.

The coupling coefficient K here relates to the ratio of the two magnetic fluxes in the two inductances, which matches the definition of the coupling coefficient K given in the introductory section of the present application. In addition, the four terminals $100a, \ldots, 100d$ of the filter 100 are each connected to a reference potential, such as, for example, ground, via a capacitance 130, 140. In the inventive electrical filter 100 shown in FIG. 1a, the two Inductances 110 and 120 each have an inductance value $L1=L2=30$ nH. The coupling coefficient K of the two inductances 110, 120 here is roughly ⅔ or $K \approx 0.67$. All four capacitances 130, 140 have an electrical capacitance of 3 pF. This concrete dimensioning of the individual devices serves as a basis for a further consideration of this embodiment and is not construed to be limiting the present invention.

The first embodiment of the inventive filter 100 shown in Filter 1a thus is an LC low-pass filter in a Pi form. The inductance is formed by a coupled coil pair and/or a transformer having a high inductance but a reduced coupling compared to a maximum coupling (coupling coefficient K close to 1). The capacitances 130, 140 and/or the corresponding capacitive contributions in the filter 100 may be formed using normal capacitances, such as, for example, capacitors, and/or capacitances of ESD diodes or ESD transistors. Since these ESD devices, i.e. ESD diodes and ESD transistors, generally act like capacitances in the high frequency area, these devices may also be integrated in the filter circuit.

The low-pass characteristic compared to a pure L filter is improved by using an LC filter comprising both an inductance and a capacitance, in comparison to an L filter as is used in the conventional art. The LC low-pass filter 100 has the following characteristics: due to the different equivalent circuit diagram in the case of a common mode and a differential mode, four times the capacitance of a signal conductor relative to ground, i.e. of one of the terminals $100a, \ldots, 100d$ relative to the reference potential, will always act in the case of the common mode compared to the case of the differential mode, between the two signal paths, i.e. between the first terminal 100a and the third terminal 100c and/or the second terminal 100b and the fourth terminal 100d of the filter 100. More explicitly, this is due to the fact that in the case of the common mode the two signal paths through the filter 100 represent a parallel connection, whereas in the case of a differential mode the two signal paths through the filter 100 represent a series connection. For the same reason, the effective port impedances and/or terminal impedances also differ by a factor of 4. If, for example, in the differential mode the port impedance is around 100 Ω, it will be about 25 Ω in the common mode. As will be discussed in greater detail below, the result for the filter 100 will also be, as a total inductance, different effective inductances L_CM for the common mode and L_DM for the differential mode or differential signals. Due to the concrete dimensioning indicated above in the present embodiment, the effective inductance in the differential mode L_DM=20 nH and in the common mode L_CM=100 nH.

In order for an LC filter performance to form at all in the differential mode, the coupling coefficient K of the transformer must have a magnitude smaller than 1, since otherwise the effective inductance L_DM becomes very small or nearly 0 due to the negative coupling in the differential mode. Without an effective inductance and/or a vanishing effective inductance (L-DM≈0 nH), the equivalent circuit diagram of an inventive filter, however, has only one capacitance relative to a reference potential, i.e., for example, ground, so that a differential mode of an oscillation will only be subjected to a mismatch or attenuation increasing with the frequency due to this capacitance relative to ground. In the case of a vanishing effective inductance (L-DM≈=nH), the filter action thus relies only on the existence of an (effective) capacitance relative to ground. Put differently, a differential mode in this case would "see" only one capacitance relative to ground, which would result in a mismatch increasing with the frequency. Using a transformer having a coupling coefficient K of a magnitude smaller than 1 thus represents a core idea of the present invention.

A possibility of realizing a transformer having a coupling coefficient K of a magnitude smaller than 1 is implementing the two conductors of the transformer forming the two inductances 110, 120 by a distance of the two conductors to each other. Here, the magnitude of the coupling coefficient K is the smaller, the greater the spacing between the two conductors.

The two effective inductances differ, on the one hand, by the effective connection, wherein in the case of the common mode and with a symmetrical design of the filter 100, as is shown in FIG. 1a, the inductances are effectively halved due to the resulting parallel connection, whereas in the case of the differential mode the inductances are effectively doubled due to the resulting series connection of the two paths. On the other hand, the effective inductances of the common mode and the differential mode also differ due to the coupling, wherein in the case of the differential mode the result will be an effective coupling coefficient K<0 and in the case of the common mode an effective coupling coefficient K>0. Irrespective of the respective effective impedance and/or capacitance values, a low-pass filter will exist both for the case of a differential mode and for the case of a common mode.

By the different effective inductances L_CM and L_DM in the common mode and the differential mode, the result for the low-pass filter 100 will be a high edge frequency or cutoff frequency in the differential mode, i.e. for differential signals, and a low edge frequency or cutoff frequency in the common mode, i.e. for common mode signals. By varying the coupling coefficient K and the values of the capacitances 130, 140, any edge frequency or cutoff frequency of the common mode and the differential mode may basically be chosen. An ideal adjustment of the filter circuit for both modes at the same time, however, is often difficult. In a concrete design of an inventive filter 100, a compromise as to adjusting the two modes is frequently made. In particular with regard to realizing the inventive filter in the form of an integrated filter circuit, i.e. an integrated circuit, future applications will generally require using high-quality devices. Since the differential mode signal or the differential signal is transmitted, the circuit will normally be adjusted relative to the differential mode. For the embodiment of the inventive presented filter 100 shown in FIG. 1a, a good compromise results for a coupling coefficient K of roughly ⅔, i.e. approximately 0.67.

Figure 1B:
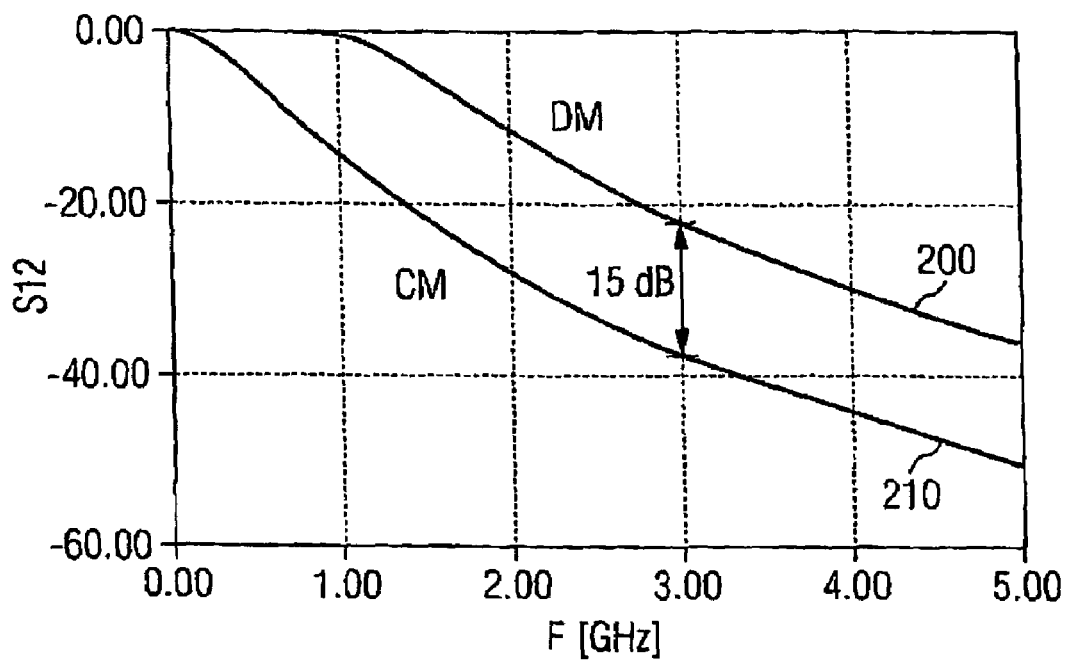

FIG. 1b shows a representation of a numerically established attenuation S12 of the embodiment of the inventive filter 100 shown in FIG. 1a as a function of the frequency F. FIG. 1b here shows an attenuation form 200 for the case of a differential mode or differential signal (DM) and an attenuation form 210 for the case of a common mode (CM). The attenuation forms 200, 210 shown in FIG. 1b are based on a consideration of an ideal case, i.e. when parasitic effects, as may, for example, be caused by (parasitic) inductances, (parasitic) capacitances and/or (parasitic) resistances, do not have to be taken into consideration. Both attenuation forms 200, 210 show, starting from an attenuation value of roughly 0 dB at a frequency F of roughly 0 GHz, a monotonous decrease with an increasing frequency F. Due to the different effective inductances L_CM=100 nH in the common mode and L_DM=20 nH in the differential mode and the corresponding effective capacitance values, the two attenuation forms 200, 210 both do show an attenuation form expected of an LC low-pass filter, the respective cutoff frequencies, however, differ considerably. While in the case of the common mode a cutoff frequency of less than 100 MHz results, the cutoff frequency in the differential mode will be at around 1 GHz. A difference relative to the attenuation of the two modes of roughly 15 dB will consequently result in the range of frequencies F above approximately 1 GHz.

The inventive LC filter shown in FIG. 1a having a coupling coefficient K of roughly 0.67 thus exhibits a low-pass performance of a 3-pole filter having a high common mode attenuation due to the effective inductance L_CM=100 nH (CM attenuation) and a low differential mode attenuation due to the resulting low-pass characteristic. The inventive electrical filter 100 in the design shown in FIG. 1a thus allows significantly attenuating common mode signals in a frequency range beginning at around 200 MHz and ending at 1 GHz, whereas a differential signal may pass the filter 100 nearly unattenuated in this frequency range. Only in the range of frequencies above 1 GHz will both the common mode signals and the differential signals be attenuated and/or filtered, wherein in this frequency range the attenuation of the differential signal will be about 15 dB below that of the common mode signals.

Figure 2A:
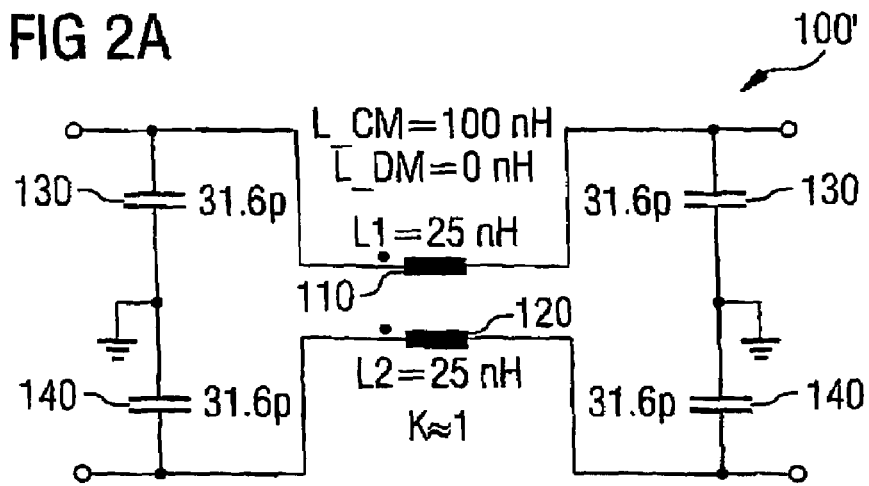
FIGS. 2a and 2b show a circuit diagram of a reference example and a representation of two attenuation forms.
Figure 5A:
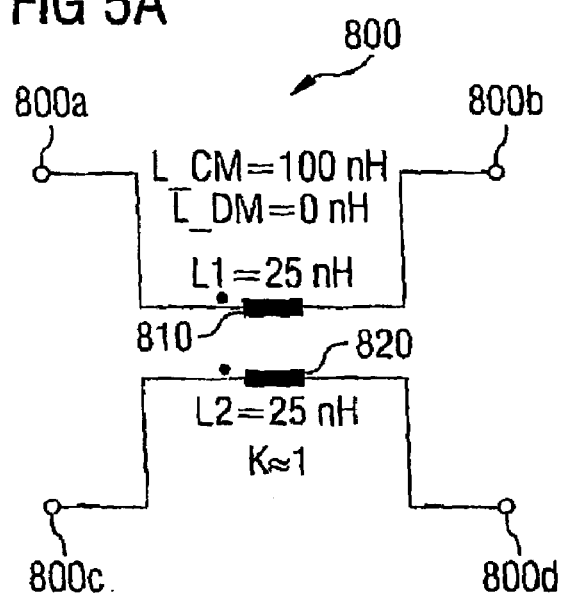
FIGS. 5a and 5b show a circuit diagram of a transformation filter and a representation of three attenuation forms established numerically.
Figure 5B:
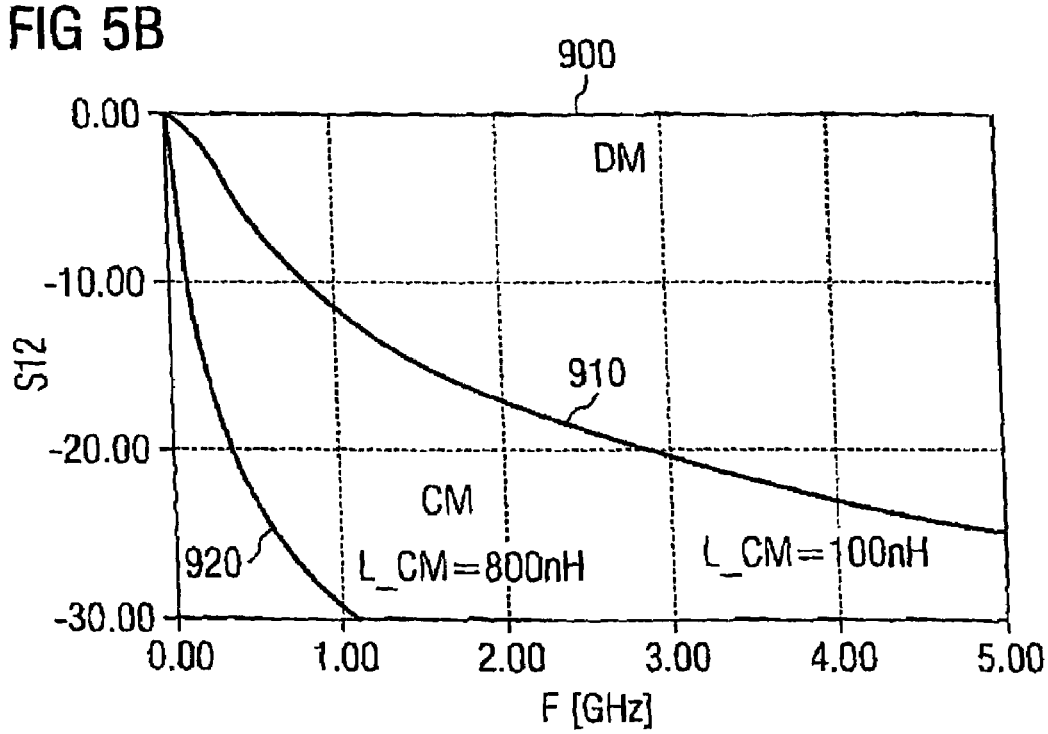

In order to explain the aspect mentioned above in greater detail, namely that the coupling coefficient K of the transformer of the inventive filter 100 has to have a magnitude smaller than 1 to achieve an LC low-pass filter characteristic in the differential mode, i.e. for differential signals, FIG. 2a shows a circuit diagram of a comparative example. This comparative example 100' of the inventive filter 100 of FIG. 1a differs, as far as basic wiring is concerned, from the filter 100 only with regard to the dimensioning of the two inductances 110, 120, the dimensioning of the capacitances 130, 140 and the dimensioning of the coupling coefficient K of the transformer including the two inductances 110, 120. Thus, the two inductances 110, 120 each have a self-inductance L1=L2=25 nH, the capacitances 130, 140 each have a capacitance of 31.6 pF and the transformer has a coupling coefficient of roughly 1. Due to the dimensioning of the two inductances 110, 120 and the coupling coefficient K of roughly 1 of the transformer, in analogy to the possible solution of a filter 800 of the conventional art shown in FIG. 5, the result is an effective inductance in the common mode of L_CM=100 nH and an effective inductance in the differential mode of roughly L_DM=0 nH, so that the filter effect for differential signals relies only on the existence of a capacitance relative to ground.

Figure 2B:
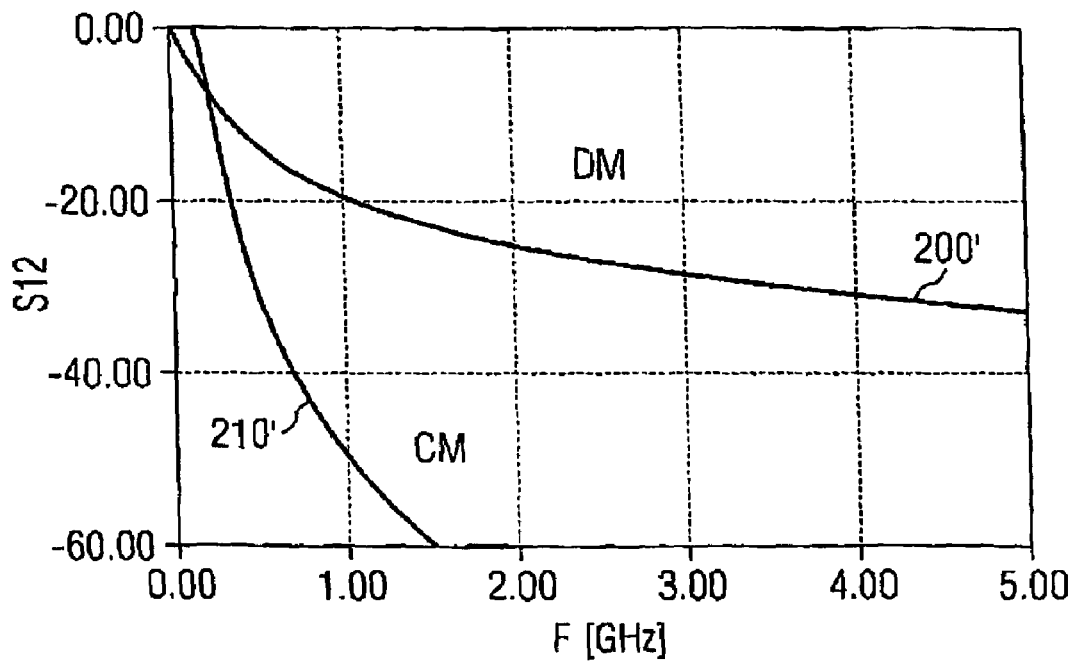

FIG. 2b shows a representation of two attenuation forms 200', 210' for the differential mode (DM) and the common mode (CM) of the filter 100' shown in FIG. 2a. The attenuation form 210' of the common mode exhibits a similar form to the attenuation form of the common mode 210 of the inventive filter 100 shown in FIG. 1a, even if the attenuation form 210' decreases considerably stronger than the attenuation form 210 with an increasing frequency F due to a higher effective capacitance of the filter 100' in a frequency range above around 100 MHz. The attenuation form 200' of the differential mode, however, differs significantly from the attenuation form 200 of the differential mode of the filter 100, since, as has been discussed above, in the case of the differential mode the effective inductance L_DM here basically vanishes. Thus, the attenuation performance 200' is basically determined by the effective capacitance given by the capacitances 130, 140. Due to the high effective capacitance, the filter 100' exhibits high attenuation in the differential mode. Thus, the attenuation form 200' has no frequency range on the scale shown in FIG. 2b where the attenuation S12 shows a plateau-shaped region at around 0 dB. In the common mode, the filter 100' shown in FIG. 2a exhibits very high attenuation due to the high effective inductance of the common mode of L_CM=100 nH and due to the effective capacitance.

As a consequence of a corresponding plateau-shaped region of the attenuation form 210' for the common mode, the result will even be a frequency range up to 150 MHz where the attenuation of the differential mode exceeds the attenuation of the common mode, i.e. where the actual useful signal in the form of the differential mode is attenuated stronger than the disturbances in the form of the common mode.

This example illustrates very clearly that a coupling coefficient K of the transformer having a magnitude smaller than 1 is of essential importance for an inventive filter 100. Typical values for an inventive coupling coefficient have a magnitude in the region between 0.05 and 0.95. It has been found out that for considered applications in the field of telecommunications and information technology a coupling coefficient in the range between 0.25 to 0.75 provides good filter characteristics. The coupling coefficient $K \approx 2/3 \approx 0.67$ on which the embodiment shown in FIG. 1a and the embodiments shown in FIGS. 3 and 4 and discussed in greater detail below are based is a good compromise for the inventive filter concept presented here, however must not be construed as limiting with regard to the coupling coefficient K.

Since additionally today's conventional discrete transformers have a coupling coefficient K of almost 1, inventive LC filters cannot be realized in a discrete setup type at present. In the case that uncoupled coils are used, i.e. that the "transformer" has a coupling coefficient K=0, the resulting filter will have a filter performance which is identical for both modes. An inventive filter 100 thus requires a coupling coefficient in the range between 0 and 1.

Like in classical LC filters, any multi-stage filters can be manufactured and implemented apart from single-stage ones. Here, the respective inductances and capacitances can be specially adjusted or optimized to the respective application in every stage. Exemplarily, the filter characteristic can be improved by such a cascading or series connection of filter stages, as the following embodiments will show.

Figure 3A:
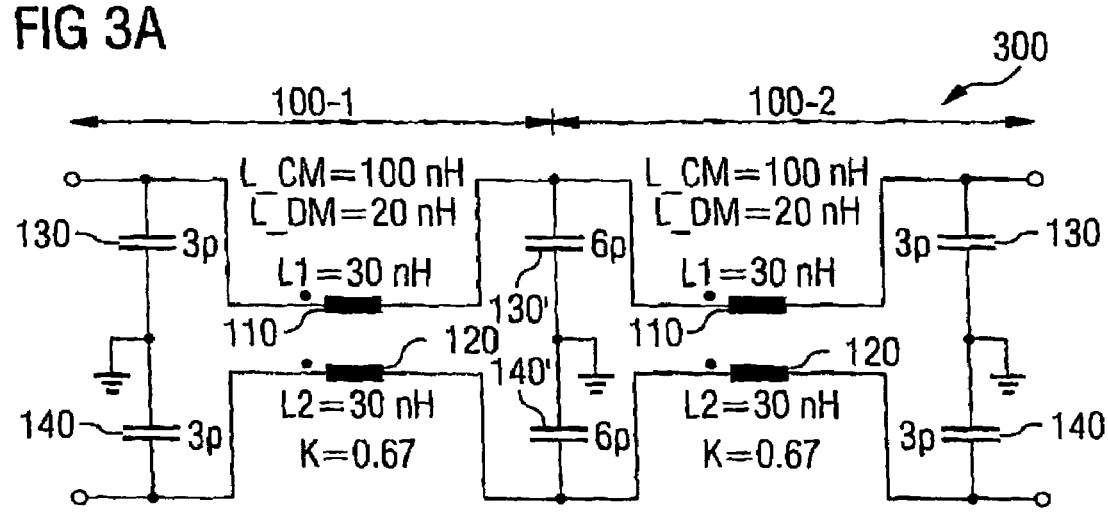
FIGS. 3a and 3b show a circuit diagram of a second embodiment of an inventive filter and a representation of two attenuation forms.

FIG. 3a shows such a second embodiment of an inventive electrical filter 300 which in principle is a series connection of two filter stages 100-1, 100-2 of the inventive filter 100 shown in FIG. 1a. The setup and dimensioning of the two filter stages 100-1 and 100-2 only differ from the setup and dimensioning of the inventive filter 100 shown in FIG. 1a in that the filter 300 principally has a parallel connection of two capacitances 130 and 140 each at the "interface" of the two filters stages 100-1 and 100-2, so that the filter 300, instead of a parallel connection of two capacitances 130 and/or 140, each has a capacitance 130' and/or 140' the capacitance values of which are doubled compared to the capacitances 130, 140, i.e. they both have a capacitance of 6 pF each. In this case, too, in analogy to the filter 100, the two filter stages 100-1 and 100-2 have an effective inductance L_DM=20 nH in the differential mode and an effective inductance L_CM=100 nH in the common mode.

Figure 3B:
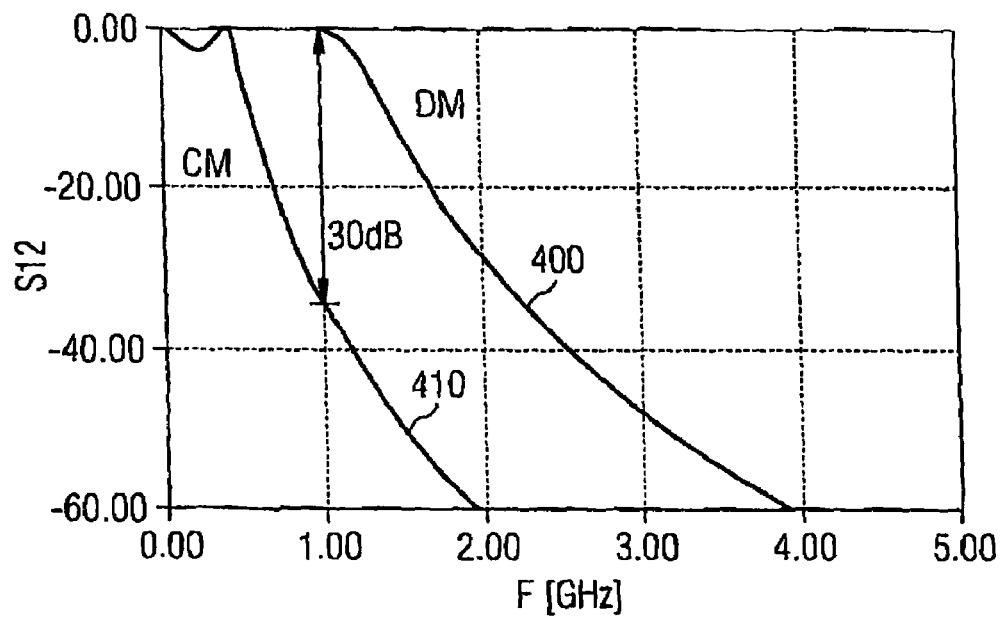

FIG. 3b shows two numerically established attenuation forms 400, 410 of the filter 300 shown in FIG. 3a. The attenuation form 400 which in FIG. 3b is also referred to as DM is the attenuation form of the filter 300 in the differential mode. The attenuation form 400 shows an attenuation form typical of a low pass having a cutoff frequency of around 1.05 GHz, wherein the attenuation form 400 has a smaller dependence on the frequency F in a frequency range below the cutoff frequency, in contrast to the attenuation form 200 shown in FIG. 1b. The attenuation form 410 referred to as CM in FIG. 2b for the common mode of the filter 300 also has a corresponding rippled performance in a range below a cutoff frequency of the common mode which is at around 500 MHz. Both attenuation characteristics 400, 410 thus have a Chebyshev-type performance in their respective pass regions, i.e. have an attenuation form in their respective pass regions varying between a maximum and a minimum value and thus each having one or several local maximums or minimums. A direct comparison of the attenuation characteristics 400 and 200 and 410 and 210 of the two-stage filter 300 and the single-stage filter 100, respectively, shows that both the attenuation form of the differential mode 400 and the attenuation form of the common mode 410 are considerably steeper than the respective attenuation forms 200 and 210, respectively, of the single-stage filter 100.

The inventive LC filter 300 having a coupling coefficient $K \approx 2/3 \approx 0.67$ which is a five-pole filter thus has a high attenuation in the common mode due to the effective inductance L_CM of the two filter stages of roughly 2·100 nH. Due to the low-pass filter characteristic in the differential mode, the attenuation in the differential mode is very low up to a cutoff frequency of about 1.05 GHz, so that, exemplarily, at a frequency of roughly 1 GHz, the result is an attenuation of the common mode relative to the differential mode of about 30 dB. In addition, the embodiment of the inventive filter 300 shows that a very high attenuation of the common mode is achievable by using a multi-pole filter.

FIG. 4 shows a third embodiment of an inventive filter 500 which is a series connection of three filter stages 100-1, 100-2, 100-3 of the inventive filter 100, i.e. a three-stage filter. Here, too, the dimensioning of the individual filter stages 100-1, 100-2, 100-3 principally does not deviate from the dimensioning of the filter 100 shown in FIG. 1a, wherein, however, at the two "interfaces" of the filter stages 100-1 and 100-2 and/or the filter stages 100-2 and 100-3, due to the resulting parallel connection of two capacitances 130 and/or 140 each, capacitances 130' and 140' having a capacitance doubled relative to the capacitances 130 and 140, respectively, are implemented in the filter 500 at these positions. Apart from this, the individual filter stages 100-1, 100-2, 100-3 do not differ from the inventive filter 100 shown in FIG. 1*a*, so that each filter stage 100-1, 100-2, 100-3 in the common mode has an effective inductance L_CM=100 nH and an effective inductance L_DM=20 nH in the differential mode. The filter 400 thus is an LC filter having a coupling coefficient K≈⅔≈0.67 and a seven-pole filter.

Figure 4A:
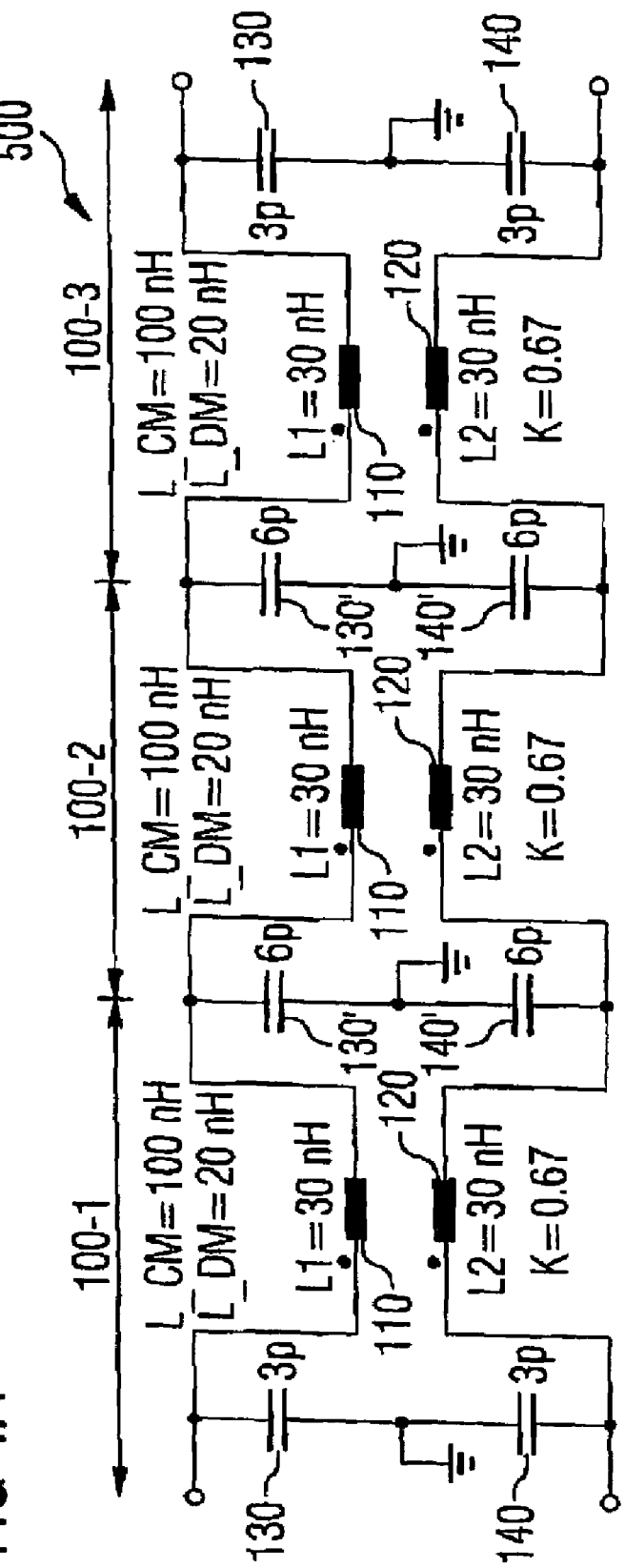

FIG. 4*b* shows two numerically established attenuation forms 600, 610 for the filter 500 shown in FIG. 4*a*. The attenuation form 600 which in FIG. 4*b* is also referred to as DM shows the attenuation form of the filter 500 for the differential mode. The attenuation form 610 which in FIG. 4*b* is also referred to as CM shows the attenuation form of the filter 500 in the common mode. Both attenuation forms 600, 610 have a typical low-pass filter characteristic having a Chebyshev-type performance, wherein the attenuation form 600 has, as does the attenuation form 400, a considerably lower ripple than the attenuation form 610 and 410, respectively. Both attenuation forms 600, 610 illustrated in FIG. 4*b*, as is also the case in the attenuation forms illustrated in FIGS. 1*b*, 2*b*, 3*b* and 5*b*, are based on assumptions which are only true in an ideal case, i.e. taking parasitic effects, as are, for example, caused by (parasitic) inductances, (parasitic) capacitances and/or (parasitic) resistances, into consideration is not necessary. In this filter 500, too, the different effective inductance of the common mode L_CM and the effective inductance of the differential mode L_DM become evident in the form of different cutoff frequencies or edge frequencies for the two modes. Whereas the cutoff frequency of the common mode in turn is around 500 MHz, the cutoff frequency of the differential mode is around 1.1 GHz. Due to the three-stage design of the filter 500, it has a considerably steeper attenuation for frequencies above the respective cutoff frequencies compared to the two-stage filter 300 and/or the one-stage filter 100, so that, for example, the attenuation of the differential mode is lower by around 60 dB relative to the attenuation of the common mode in the filter 500 at a frequency of roughly 1.1 GHz.

As the three embodiments of the inventive filter 100, 300, 500 have shown, the inventive filter is a passive mode-selective filter which may be employed for all apparatuses having differential interfaces for blocking external disturbances in the form of a common mode in the range of roughly 800 to 6000 MHz and which can also be utilized as a multi-stage filter. The inventive filter 100, 300, 500, due to the coupling coefficient of the transformer having a magnitude below 1, for the common mode and the differential mode, has a low-pass filter characteristic, wherein the cutoff frequency of the differential mode is above the cutoff frequency of the common mode. By a suitable design and/or dimensioning of the inductances, the coupling coefficient of the transformer and the capacitances, it is possible to implement the inventive filter practically for nearly any combination of useful signals in the differential mode and disturbance signals in the common mode, so that the useful signals may pass the filter, whereas the disturbance signals are blocked or attenuated by the filter.

Here, the embodiments shown in FIGS. 1*a*, 3*a*, 4*a* only represent dimensionings of the filters to be construed as being exemplary. Differing from the embodiments shown, the inventive filter may also be of a non-symmetrical implementation of the individual components, in particular of the inductances 110, 120 and the capacitances 130, 140, 130', 140'. Here, it is, for example, possible for the filter 100 and/or a filter stage 100-1, 100-2, 100-3 to be of an asymmetrical implementation with regard to the signal paths, i.e. exemplarily the values of the capacitances 130, 130', 140 and 140' may differ from one another, or for the values of the inductances L1 and L2 of the two inductances 110 and 120 to differ from each other.

In the case of a multi-stage design of the filter 300, 500, the individual filter stages 100-1, 100-2, 100-3 can be provided with deviating inductances 110, 120, capacitances 130, 130', 140, 140' and transformers, wherein each individual filter stage can have a symmetrical or asymmetrical design.

Also, it is conceivable in the case of the filter 100 and/or the filter stages 100-1, 100-2, 100-3 to use a design asymmetrical with regard to an input side and an output side of the filter 100 and/or of the corresponding filter stages 100-1, 100-2, 100-3 or a combination of both asymmetries. Here, an input side and an output side of the filter 100 each refer to one of the two sides the terminals of which are connected to the two inductances 110, 120. If, for example, the signal source or even the source of disturbance is connected to the first and third terminals 100*a*, 100*c*, this side will be the input side and the side including the second and the fourth terminals 100*b*, 100*d* will be the output side.

The embodiments of the inventive filter 100, 300, 500 shown in FIGS. 1*a*, 3*a* and 4*a* are implemented as Pi filters, i.e. have capacitances relative to ground both at the first and third terminals 100*a*, 100*c* and at the second and fourth terminals 100*b*, 100*d*. Apart from the asymmetry already mentioned with regard to dimensioning, an implementation in Pi form may be omitted under certain circumstances, exemplarily when no bi-directional signal filtering is necessary. In this case, i.e. when there is an input side and an output side of the filter, the capacitances 130, 140 of that side do not have to be implemented.

More precisely, in a symmetrical impedance-matched case, i.e., exemplarily, when 50 Ω are applied to both the input side of the filter and to the output side of the filter, the capacitances 130, 140 are generally necessary at the input and the output of the filter 100, 300, 500. In the case of different impedances at the input and the output, under certain circumstances impedances in the form of capacitances at the input or the output may be sufficient.

However, it is generally necessary in this case to connect, to the side of the filter having no capacitances 130, 140, an external component comprising a smaller impedance compared to another external component connected to the other side of the filter, i.e. comprises at least one of the capacitances 130, 140.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An electrical filter comprising a first terminal, a second terminal, a third terminal and a fourth terminal, comprising:
   a first inductance connected between the first terminal and the second terminal;
   a second inductance connected between the third terminal and the fourth terminal;
   a first capacitance connected between the first terminal and a reference potential; and
   a second capacitance connected between the third terminal and the reference potential, the first inductance and the second inductance forming a transformer, the transformer configured to have a coupling coefficient of a magnitude sufficient for the filter to act as a low-pass filter for differential signals and common mode signals, wherein a cutoff frequency for differential signals is higher than a cutoff frequency for common mode signals, wherein the coupling coefficient comprises a magnitude between 0.05 and below 0.75.

2. The electrical filter according to claim 1, wherein the transformer is implemented such that the first inductance and the second inductance are positively coupled.

3. The electrical filter according to claim 1, wherein the filter comprises a third capacitance connected between the second terminal and the reference potential, and a fourth capacitance connected between the fourth terminal and the reference potential.

4. The electrical filter according to claim 1, wherein the first inductance, the second inductance, the first capacitance and the second capacitance form a first filter stage; and further comprising a second filter stage coupled to the first filter stage.

5. The electrical filter according to claim 1, wherein the filter is implemented as an integrated circuit.

6. The electrical filter according to claim 4, wherein the second filter stage includes a third inductance serially coupled to the first inductance and a fourth inductance serially coupled to the second inductance.

7. An electrical filter, comprising:
a first inductance connected between a first terminal and a second terminal;
a second inductance connected between a third terminal and a fourth terminal;
a first capacitance connected between the first terminal and a reference potential; and
a second capacitance connected between the third terminal and the reference potential, the first inductance and the second inductance forming a transformer having a coupling coefficient of a magnitude sufficiently below one to enable the filter to act as a low-pass filter for differential signals and common mode signals, wherein a cutoff frequency for differential signals is higher than a cutoff frequency for common mode signals,
wherein the coupling coefficient comprises a magnitude above 0.05 and below 0.75.

8. The electrical filter according to claim 7, wherein the first inductance and the second inductance are positively coupled.

9. The electrical filter according to claim 7, wherein the filter comprises a third capacitance connected between the second terminal and the reference potential, and a fourth capacitance connected between the fourth terminal and the reference potential.

10. The electrical filter according to claim 7, wherein the first inductance, the second inductance, the first capacitance and the second capacitance form a first filter stage; and further comprising a second filter stage coupled to the first filter stage.

11. The electrical filter according to claim 7, wherein the filter is implemented as an integrated circuit.

12. An electrical filter comprising a first terminal, a second terminal, a third terminal and a fourth terminal, comprising:
a first inductance connected between the first terminal and the second terminal;
a second inductance connected between the third terminal and the fourth terminal;
a first capacitance connected between the first terminal and a reference potential; and
a second capacitance connected between the third terminal and the reference potential, the first inductance and the second inductance forming a transformer, the transformer configured to have a coupling coefficient of between 0.05 and below 0.75.

13. The electrical filter according to claim 12, wherein the transformer is implemented such that the first inductance and the second inductance are positively coupled.

14. The electrical filter according to claim 12, wherein the filter comprises a third capacitance connected between the second terminal and the reference potential, and a fourth capacitance connected between the fourth terminal and the reference potential.

15. The electrical filter according to claim 12, wherein the electrical filter is configured to have a different cutoff frequency for differential signals and common signals.

16. The electrical filter according to claim 13, wherein the filter comprises a third capacitance connected between the second terminal and the reference potential, and a fourth capacitance connected between the fourth terminal and the reference potential.

17. The electrical filter according to claim 13, wherein the first inductance, the second inductance, the first capacitance and the second capacitance form a first filter stage; and further comprising a second filter stage coupled to the first filter stage.

18. The electrical filter according to claim 8, wherein the filter comprises a third capacitance connected between the second terminal and the reference potential, and a fourth capacitance connected between the fourth terminal and the reference potential.

19. The electrical filter according to claim 8, wherein the first inductance, the second inductance, the first capacitance and the second capacitance form a first filter stage; and further comprising a second filter stage coupled to the first filter stage.

20. The electrical filter according to claim 2, wherein the filter comprises a third capacitance connected between the second terminal and the reference potential, and a fourth capacitance connected between the fourth terminal and the reference potential.

* * * * *